(12) United States Patent
Sun et al.

(10) Patent No.: US 10,566,290 B2
(45) Date of Patent: Feb. 18, 2020

(54) ALIGNMENT MARK AND MEASUREMENT METHOD THEREOF

(71) Applicant: UNITED MICROELECTRONICS CORP., Hsin-Chu (TW)

(72) Inventors: Chia-Chen Sun, Kaohsiung (TW); Yu-Cheng Tung, Kaohsiung (TW); Sheng-Yuan Hsueh, Tainan (TW); Fan-Wei Lin, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 359 days.

(21) Appl. No.: 15/715,184

(22) Filed: Sep. 26, 2017

(65) Prior Publication Data
US 2019/0067204 A1     Feb. 28, 2019

(30) Foreign Application Priority Data
Aug. 28, 2017   (TW) .............................. 106129108 A (51) Int. Cl.
| | |
|---|---|
| H01L 23/544 | (2006.01) |
| H01L 21/66 | (2006.01) |
| G01B 21/24 | (2006.01) |
| G03F 7/20 | (2006.01) |
| G01B 21/20 | (2006.01) |
| G03F 9/00 | (2006.01) |

(52) U.S. Cl.
CPC ............ *H01L 23/544* (2013.01); *G01B 21/20* (2013.01); *G01B 21/24* (2013.01); *G03F 7/70633* (2013.01); *G03F 9/7073* (2013.01); *H01L 22/12* (2013.01); *G01B 2210/56* (2013.01); *H01L 2223/5442* (2013.01); *H01L 2223/5446* (2013.01); *H01L 2223/54426* (2013.01)

(58) Field of Classification Search
None
See application file for complete search history.

(56) References Cited

U.S. PATENT DOCUMENTS

| | | | |
|---|---|---|---|
| 5,897,371 A | 4/1999 | Yeh | |
| 6,087,733 A * | 7/2000 | Maxim | ............... H01L 21/3212 257/48 |
| 7,998,827 B2 * | 8/2011 | Hatano | ............... G03F 7/70625 257/E21.54 |
| 9,437,415 B2 * | 9/2016 | Shieh | ................. H01L 21/3086 |
| 2003/0183860 A1 * | 10/2003 | Uchiyama | ............. G03F 9/7076 257/296 |

(Continued)

*Primary Examiner* — Clayton E. LaBalle
*Assistant Examiner* — Dennis Hancock
(74) *Attorney, Agent, or Firm* — Winston Hsu (57) ABSTRACT

The present invention provides an alignment mark, the alignment mark includes at least one dummy mark pattern in a first layer comprises a plurality of dummy mark units arranged along a first direction, and at least one first mark pattern located in a second layer disposed above the first layer, the first mark pattern comprises a plurality of first mark units, each of the first mark units being arranged in a first direction. When viewed in a top view, the first mark pattern completely covers the dummy mark pattern, and the size of each dummy mark unit is smaller than each first mark unit. In addition, each dummy mark unit of the dummy mark pattern has a first width, each first mark unit of the first mark pattern has a second width, and the first width is smaller than half of the second width.

14 Claims, 6 Drawing Sheets

(56) References Cited

U.S. PATENT DOCUMENTS

| | | | |
|---|---|---|---|
| 2004/0185637 A1* | 9/2004 | Fu | H01L 21/76229 |
| | | | 438/401 |
| 2009/0291513 A1* | 11/2009 | Ghinovker | G03F 7/70633 |
| | | | 438/16 |
| 2015/0362905 A1* | 12/2015 | Liou | G05B 19/188 |
| | | | 700/121 |

* cited by examiner

ALIGNMENT MARK AND MEASUREMENT METHOD THEREOF

BACKGROUND OF THE INVENTION

1. Field of the Invention

The present invention relates to semiconductor processes a field, and more particularly to an alignment mark and a measurement method thereof.

2. Description of the Prior Art

Photolithography is an essential step in semiconductor manufacturing processes, through which the pattern of integrated circuits may be transferred from photomasks to semiconductor chips. Generally, a design layout of integrated circuit provided by an IC design house may be divided into several layers of design layouts after it is received by the semiconductor manufacturing company. These design layouts may be then fabricated on the corresponding transparent plates to thereby form photomasks with desired layouts. The layout of each of the photomasks may be respectively transferred to a photoresist layer on the chip through suitable photolithographic process. Afterwards, other suitable processes, such as etching, deposition, doping, CMP, thermal/annealing and so forth may be carried out in order to obtain required semiconductor devices.

Recently, the measurement of the overlay between two or more successive layers becomes more and more important along with the continuous miniaturization in integrated circuits. For instance, through vias and contacts are often used to electrically connect interconnections in different layers to one another. Because the interconnections, the through vias and/or the contacts are generally disposed in different layers, a process of overlay measurement needs to be carried out during each of the corresponding photolithographic processes so as to ensure the minimum shift between successive layers.

However, the current overlay measurement still has some drawbacks. For example, due to measurement deviation, the measured values of relative positions between successive layers often fail to reflect their real positions. Therefore, the measurement results often include overlay error.

Accordingly, there is a need to provide an improved method of correcting overlay error so as to increase the accuracy of the measurement results.

SUMMARY OF THE INVENTION

The present invention provides an alignment mark, the alignment mark includes at least one dummy mark pattern in a first layer comprises a plurality of dummy mark units arranged along a first direction, and at least one first mark pattern disposed in a second layer, the second layer is disposed above the first layer, the first mark pattern comprises a plurality of first mark units, each first mark unit being arranged in a first direction, wherein when viewed in a top view, the first mark pattern completely covers the dummy mark pattern, and the size of each dummy mark unit is smaller than each first mark unit, in addition, each dummy mark unit of the dummy mark pattern has a first width, each first mark unit of the first mark pattern has a second width, and the first width is smaller than half of the second width.

The present invention further provides a method for measuring an alignment mark, the method includes: firstly, an alignment mark is provided, the alignment mark includes at least one dummy mark pattern in a first layer comprises a plurality of dummy mark units arranged along a first direction, and at least one first mark pattern disposed in a second layer, the second layer is disposed above the first layer, the first mark pattern comprises a plurality of first mark units, each first mark unit being arranged in a first direction, wherein when viewed in a top view, the first mark pattern completely covers the dummy mark pattern, and the size of each dummy mark unit is smaller than each first mark unit, in addition, each dummy mark unit of the dummy mark pattern has a first width, each first mark unit of the first mark pattern has a second width, and the first width is smaller than half of the second width. Afterwards, the alignment mark is measured to obtain a first signal waveform corresponding to the first mark pattern, and a second signal waveform corresponding to the dummy mark pattern, wherein the first signal waveform has a first highest value, the second signal waveform has a second highest value, and the first highest value is more than two times of the second highest value.

One feature of the present invention is that plurality of dummy alignment marks are added in the blank region. In this way, it is possible to reduce the dishing phenomenon caused by the blank region when the planarization step is performed. Therefore, if other alignment marks are formed in other layer structures to overlap the blank region, the accuracy of the alignment step can be improved.

These and other objectives of the present invention will no doubt become obvious to those of ordinary skill in the art after reading the following detailed description of the preferred embodiment that is illustrated in the various figures and drawings.

DETAILED DESCRIPTION

In the following description, numerous specific details are given to provide a thorough understanding of the invention. It will, however, be apparent to one skilled in the art (note: of ordinary skill in the art) that the invention may be practiced without these specific details. Furthermore, some well-known system configurations and process steps are not disclosed in detail, as these should be well-known to those skilled in the art.

Likewise, the drawings showing embodiments of the apparatus are not to scale and some dimensions are exaggerated for clarity of presentation. Also, where multiple embodiments are disclosed and described as having some features in common, like or similar features will usually be described with same reference numerals for ease of illustration and description thereof.

Figure 1:
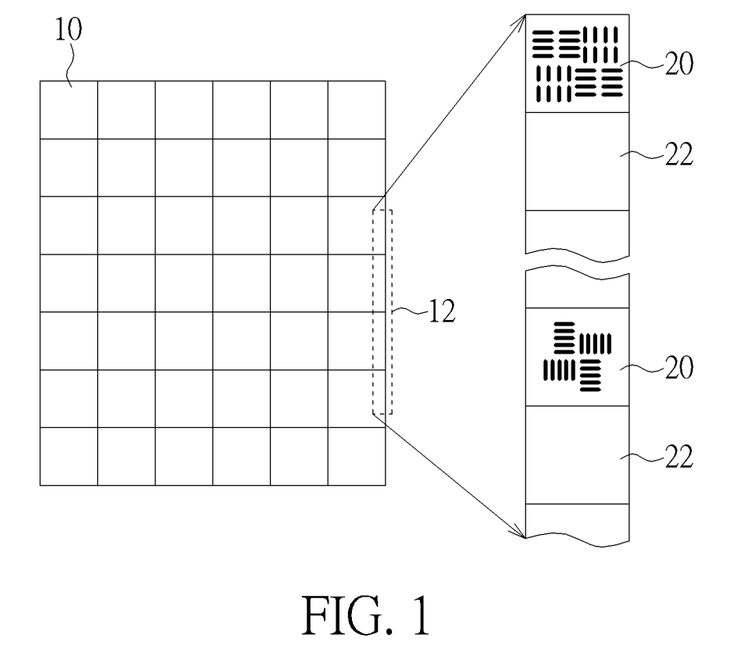
FIG. 1 shows a schematic diagram of a blank region defined in a scribe line of the present invention.

Firstly, please refer to FIG. 1, the present invention provides an alignment mark. This alignment mark is often set in a scribe line 12 of a wafer 10. It is noteworthy that in a normal semiconductor process, different layers are sequentially formed on the wafer 10. For one layer formed by a particular process, the area where the alignment mark disposed therein is defined as an alignment region 20, and the area where disposed adjacent to the alignment region 20, and the alignment mark does not disposed therein is defined as a blank region 22. Applicants have found that since there is no other elements formed in the blank region 22, so that the blank region 22 tends to cause a dishing phenomenon (that means the top surface of the layer will recessed) when the semiconductor process is carried out on the wafer 10, in particular in the planarization step (e.g., chemical mechanical polishing, CMP). In the following steps, if other alignment marks is formed in other layers, and overlaps the blank region 22, the dishing phenomenon will affect the accuracy of the alignment process in the following steps.

Figure 2:
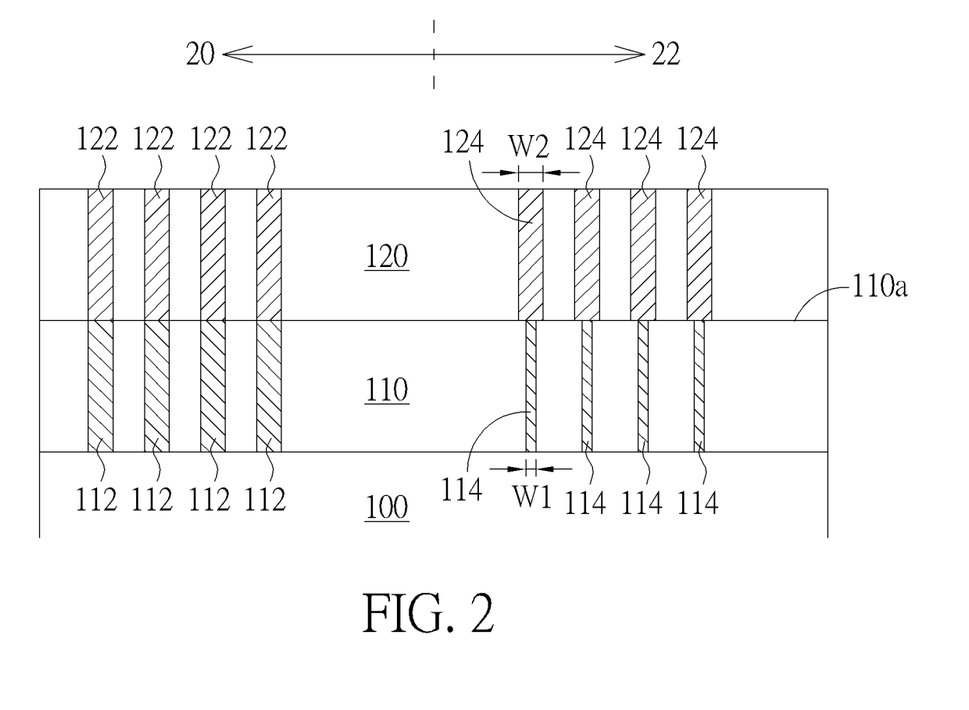
FIG. 2 is a schematic cross-sectional diagram of the alignment marks of the present invention formed on a substrate.
Figure 3:
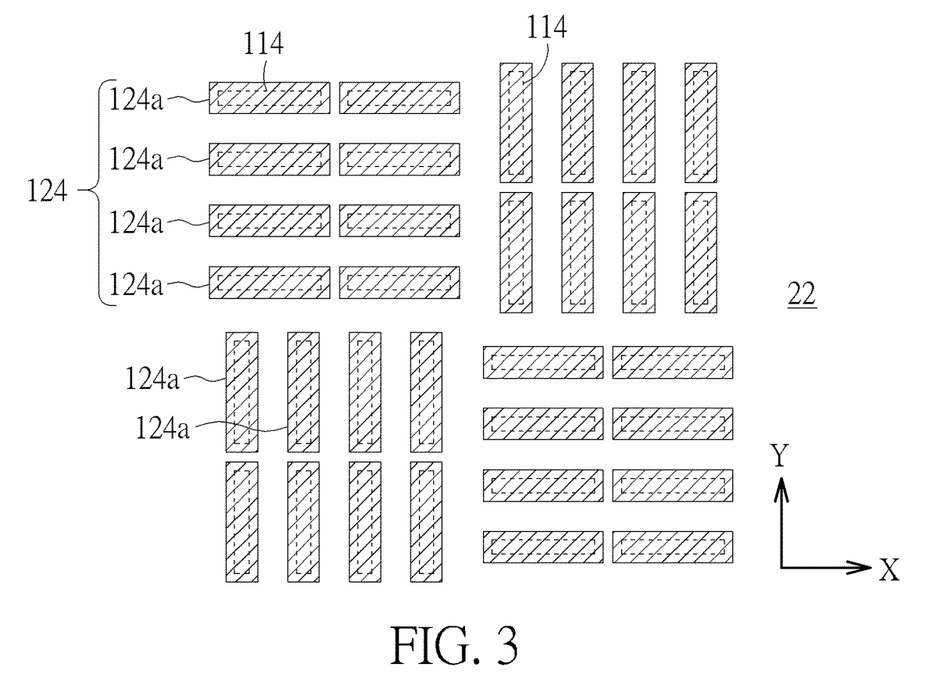
FIG. 3 shows the top view in the blank region.

Therefore, one feature of the present invention is that further providing a dummy alignment mark in the blank region 22. In this way, it is possible to reduce the dishing phenomenon happened in the blank region 22 when the planarization step is performed. Please refer to FIG. 2 and FIG. 3, FIG. 2 is a schematic cross-sectional view of the alignment mark of the present invention formed on a substrate. FIG. 3 is a top view of the blanking region, in which the alignment mark of the present invention is located. As shown in FIG. 2, a substrate 100 is defined with an alignment region 20 and a blank region 22, for example, the substrate of the scribe line 12 mentioned above. In the alignment region 20, a plurality of first alignment marks 112 are located within a first layer 110 on the substrate 100, and a plurality of second alignment marks 122 are located within a second layer 120 which is disposed above the first layer 110. The second layer 120 directly contacts the first layer 110. Within the blank region 22 next to the alignment area 20, a dummy alignment mark includes a plurality of dummy alignment mark units 114 are located within the first layer 110 on the substrate 100, and a plurality of third alignment marks 124 are located within the second layer 120. In some embodiments, each third alignment mark 124 is in directly contacts each dummy alignment mark unit 114.

It is to be noted that the first alignment mark 112 and the second alignment mark 122 are aligned with each other to avoid an offset between the elements of the different layers in the semiconductor process. The above features are well-known to those skilled in the art and are not mentioned here.

In the present invention, the third alignment mark 124 is the alignment mark that formed in the blank region 22 described above, and the third alignment mark 124 is located in the second layer 120. As mentioned above, if the layer under the second layer 120 (i.e., the first layer 110) 120 does not form any element therein, the dishing phenomenon is easily to occur during the planarization process. Thus, the present invention further adds a plurality of dummy alignment mark units 114 in the first layer 110, thereby reducing the recessing in the blank region 22 due to the planarization process. In other words, the first layer 110 of the present invention has a flat top surface 110a.

Please refer to FIG. 3, in this embodiment and when viewed in a top view, each third alignment mark 124 in the blank region 22 includes a plurality of rectangular patterns 124a, to compose a grid pattern and arranged in a first direction (e.g., an X-axis) or a second direction (e.g., Y-axis). Similarly, the amounts of the dummy alignment mark units 114 are same as that of the third alignment mark 124, and the shapes are of the dummy alignment mark units 114 are same as or similar to that of the third alignment mark 124 (for example, all of them are rectangular), but the size of each dummy alignment mark unit 114 is smaller than the size of each third alignment mark 124. In other words, in the blank region 22, each third alignment mark 124 completely covers each dummy alignment mark unit 114. In this embodiment, the number and shape of each dummy alignment mark unit 114 are designed to be same as the third alignment mark 124, therefore, from the top view, the dummy alignment mark unit 114 is covered by another alignment mark (i.e. the third alignment mark 124) and does not form extra alignment marks in the blank region. It is possible to reduce the interference and the error generated by the subsequent alignment process.

Preferably, as shown in FIG. 2, the width of the dummy alignment mark unit 114 will be smaller than half of the width of the corresponding third alignment mark 124. For example, the width of a dummy alignment mark unit 114 is W1, the width of the corresponding third alignment mark 124 located directly above the dummy alignment mark unit 114 is W2, and the limitation of W1<W2/2 is satisfied, but the present invention is not limited thereto.

Figure 4:
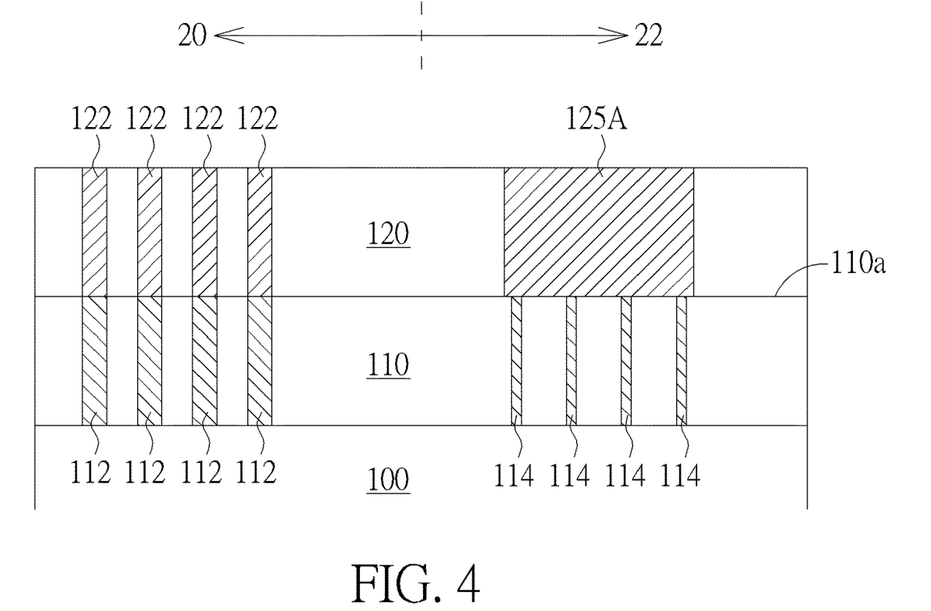
FIG. 4 is a schematic diagram of the alignment mark according to another embodiment of the present invention.
Figure 5:
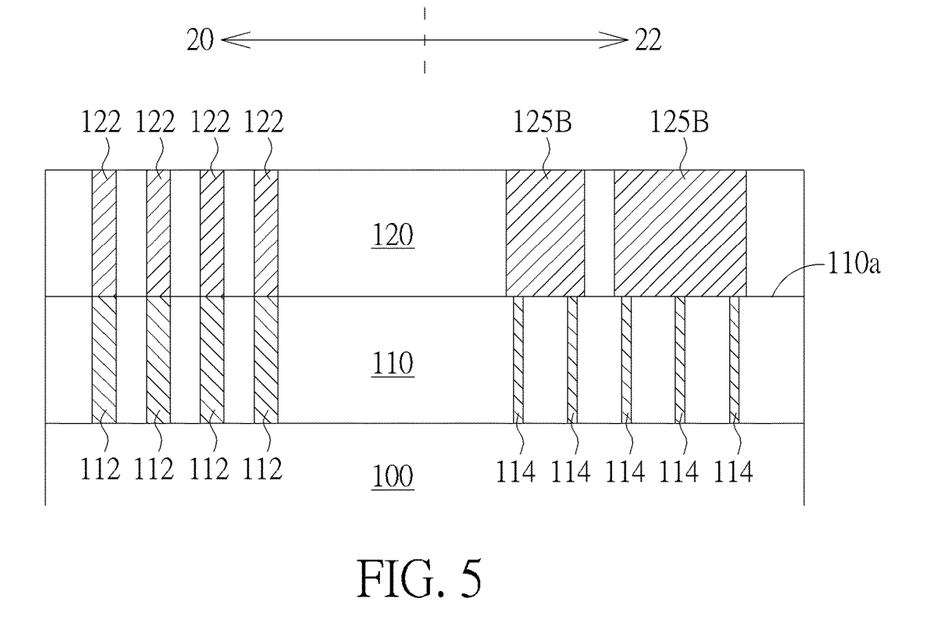
FIG. 5 is a schematic diagram of the alignment mark according to another embodiment of the present invention.

In another embodiment of the present invention, as shown in FIG. 4, at least one third alignment mark 125A is located in the second layer and completely covers each of the dummy alignment mark units 114. In this embodiment, the number of the third alignment mark is different from the number of the dummy alignment mark units 114. For example, one single third alignment mark 125A covers a plurality of dummy alignment mark units 114 simultaneously. Or as shown in FIG. 5, the plurality of third alignment marks 125B cover a plurality of dummy alignment mark units 114, each third alignment mark 125B corresponding to a plurality of dummy alignment mark units 114. It should also be within the scope of the present invention. Other features are the same as those in the above-described embodiments, and will not be described here again.

Figure 6:
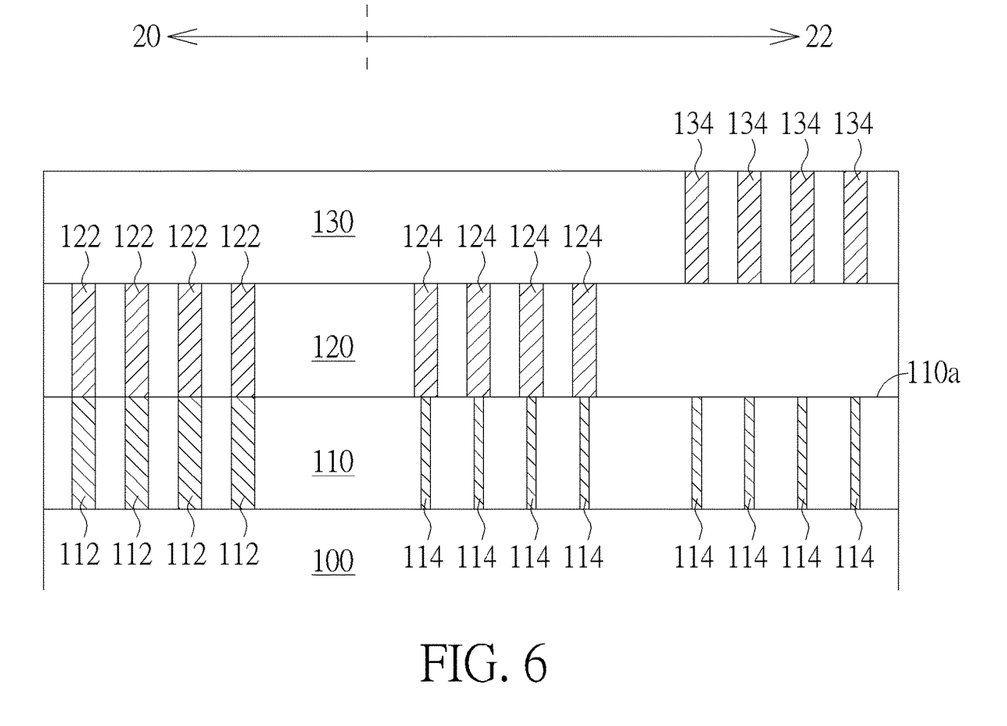
FIG. 6 is a schematic diagram of the alignment mark according to another embodiment of the present invention.
Figure 7:
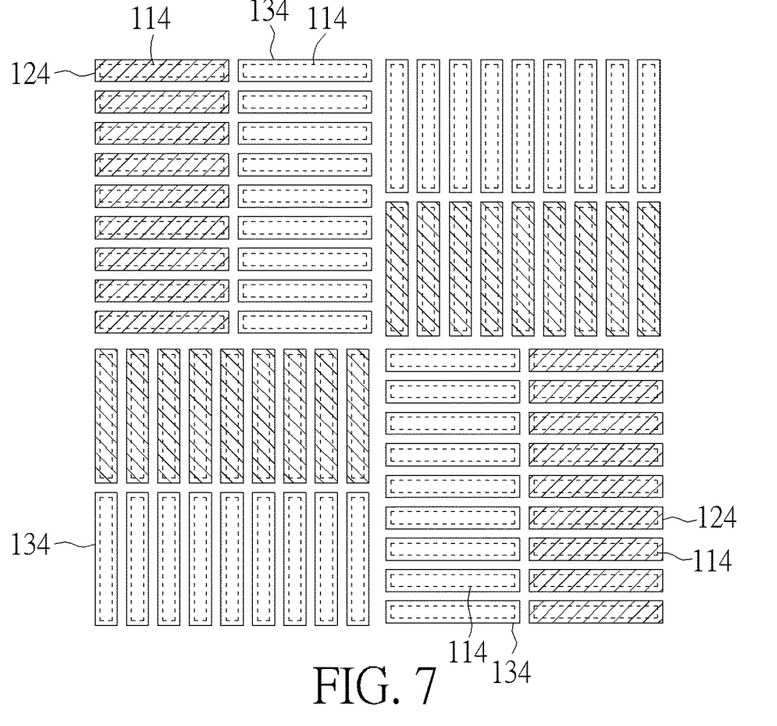
FIG. 7 shows the top view diagram of the alignment mark in FIG. 6.

In another embodiment of the present invention, please refer to FIG. 6, in the blank region 22, a third layer 130 is formed on the second layer 120, and a fourth alignment mark 134 is located within the third layer 130. As shown in FIG. 6, the fourth alignment mark 134 may be shaped like the third alignment mark 124 shown in FIG. 6, for example, a grid shape formed by a plurality of rectangular patterns. In addition, the fourth alignment mark 134 may be arranged in a first direction (e.g., the X-axis) or a second direction (e.g., the Y-axis), but is not limited thereto. In the present embodiment, the fourth alignment mark 134 is spaced from the dummy alignment mark unit 114 by the second layer 120. As seen from the top view, the fourth alignment mark 134 also completely covers the dummy alignment mark unit 114 as shown in FIG. 7. The present embodiment is also within the scope of the present invention. In the present embodiment, the third alignment mark 124 and the fourth alignment mark 134 are located at different layers, and they are labeled by different shading patterns.

Figure 8:
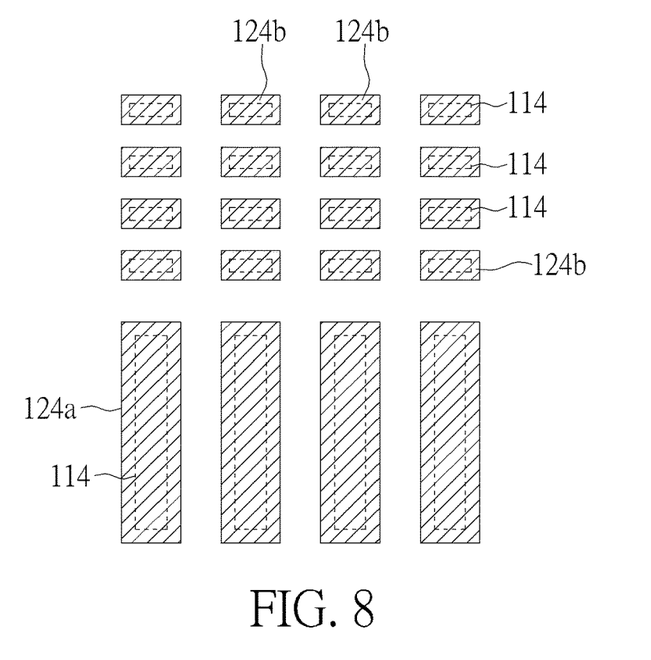
FIG. 8 illustrates a partial top view diagram of an alignment mark according to another embodiment of the present invention.
Figure 9:
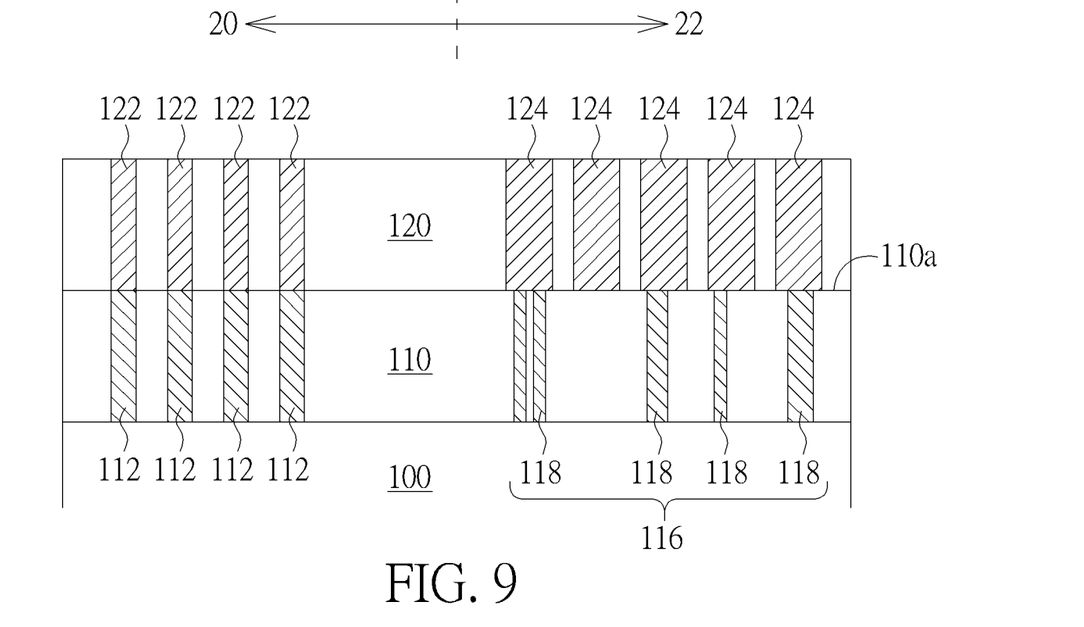
FIG. 9 is a schematic cross-sectional diagram of an alignment mark according to another embodiment of the present invention.
Figure 10:
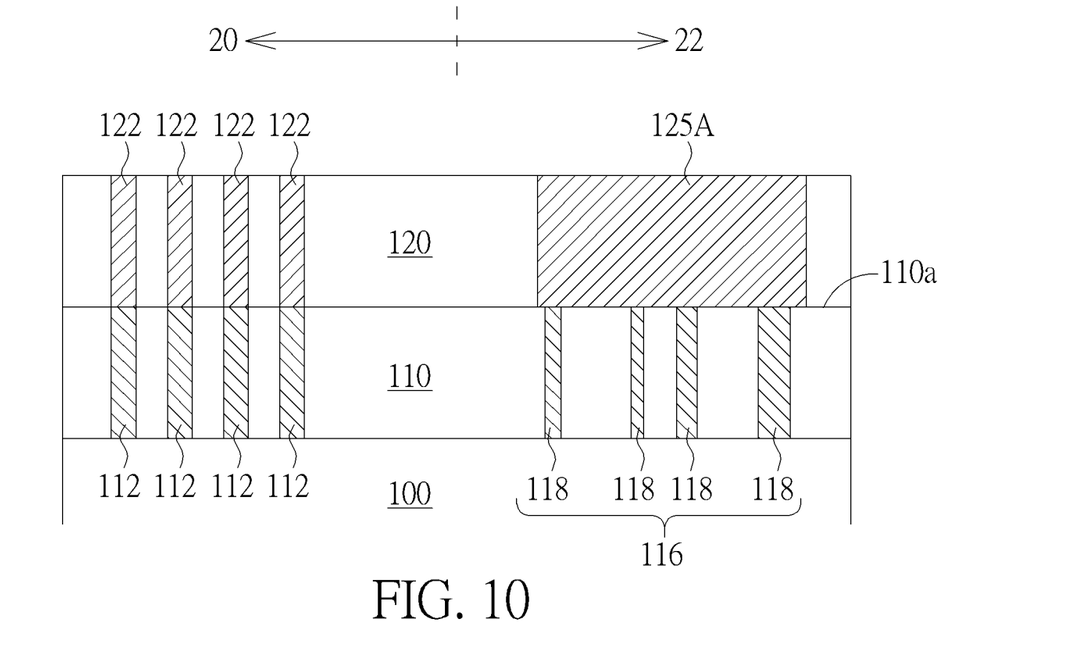
FIG. 10 is a schematic cross-sectional diagram of an alignment mark according to another embodiment of the present invention.

In another embodiment of the present invention, each rectangular pattern may be divided into a plurality of smaller rectangular patterns. For example, as shown in FIG. 8, parts or all of the rectangular pattern 124a will be further divided into a plurality of rectangular patterns 124b having smaller sizes, so that one alignment mark will contain patterns having different sizes, to improve the diversity of the mark pattern. Or as shown in FIG. 9, a dummy alignment mark 116 comprises a plurality of dummy alignment mark units 118. The size of each dummy alignment mark unit 118 may different from each other, and the pitches (the spacing) between each two adjacent dummy alignment mark units 118 are also different. Each dummy alignment mark unit 118 is covered by the same number of third alignment marks 124, or a plurality of dummy alignment mark units 118 are covered by one single third alignment mark 125A (as shown in FIG. 10), which is also within the scope of the present invention. In addition, the present invention does not limit the exactly shape of the alignment mark pattern, the shape may include such as rectangular, circular, triangular or other irregular patterns, all of them should be comprised in the scope of the present invention.

Figure 11:
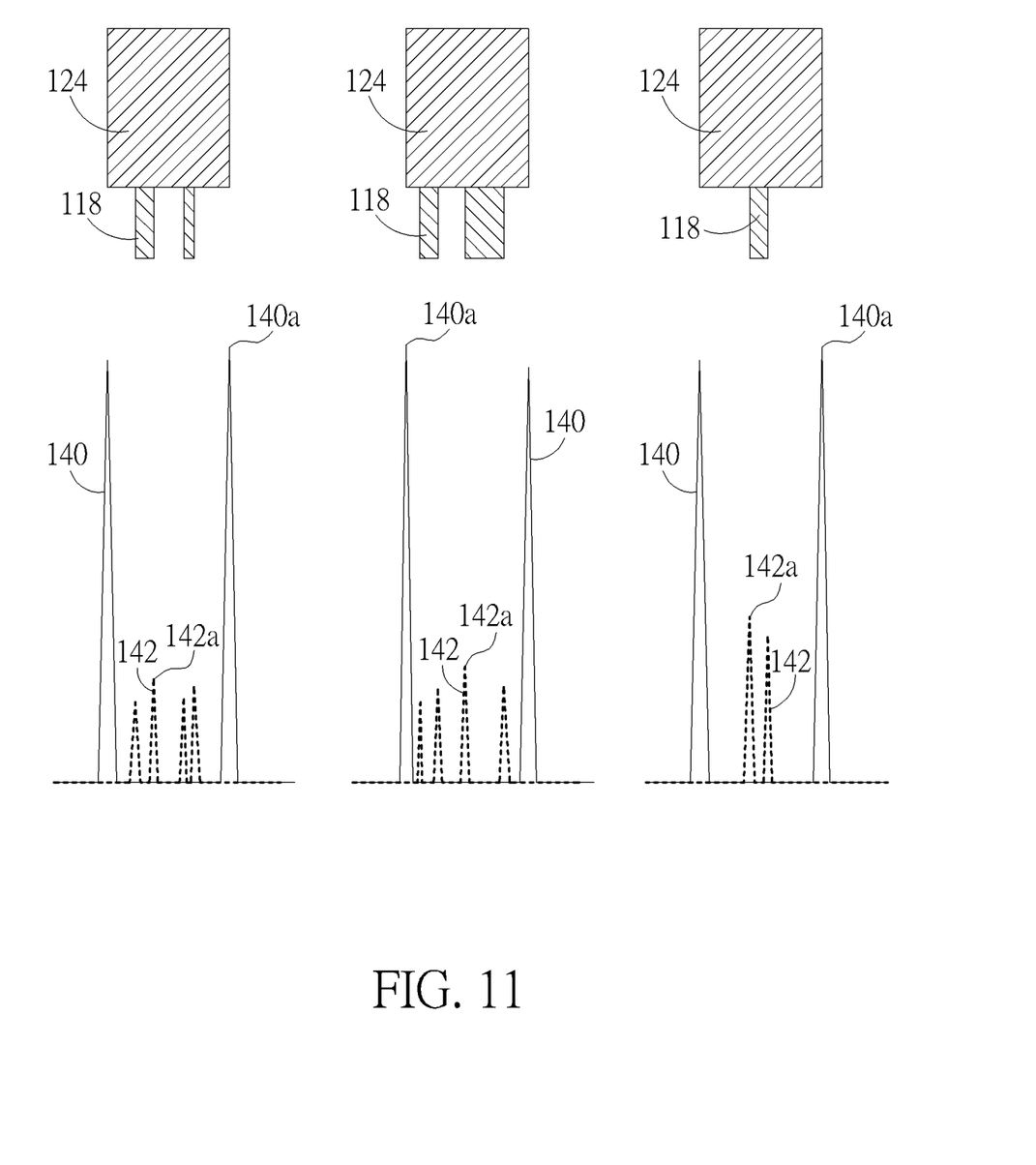
FIG. 11 shows a signal intensity plot obtained by plotting the dummy alignment mark unit and the third alignment mark in the blank area.

FIG. 11 shows a signal intensity plot obtained by plotting the dummy alignment mark unit and the third alignment mark in the blank area 22 (such as by performing a stacking offset measurement step). The upper half of FIG. 11 shows the third alignment mark 114 and a plurality of dummy alignment mark units 118 which are completely covered by the third alignment marks 114, and the remaining elements are omitted. The lower half of FIG. 11 shows the signal intensity plot obtained by performing a stacking offset measurement step. As shown in FIG. 11, the signal 140 corresponds to the third alignment mark 114, and the signal 142 corresponds to the dummy alignment mark units 118, the signal 140 has a plurality of spikes 140a corresponding to the boundaries of each third alignment marks 114, such as the left and the right sides of the third alignment mark 114 in FIG. 11. Likewise, the signal 142 has a plurality of spikes 142a corresponding to the boundaries of the each dummy alignment mark units 118 (such as the left and the right sides of each dummy alignment mark unit 118 in FIG. 11). In addition, the spike 140a is preferably more than twice as large as the spike 142a, but is not limited thereto. The intensity of the scanning signal of the third alignment mark 114 in the present invention is significantly greater than the intensity of the scanning signal of the dummy alignment mark unit 118, so that the dummy alignment mark unit 118 does not affect the alignment step.

In summary, one feature of the present invention is that plurality of dummy alignment marks are added in the blank region. In this way, it is possible to reduce the dishing phenomenon caused by the blank region when the planarization step is performed. Therefore, if other alignment marks are formed in other layer structures to overlap the blank region, the accuracy of the alignment step can be improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An alignment mark, comprising:
   at least one dummy mark pattern in a first layer comprises a plurality of dummy mark units arranged along a first direction; and
   at least one first mark pattern disposed in a second layer, the second layer is disposed above the first layer, the first mark pattern comprises a plurality of first mark units, each first mark unit being arranged in a first direction, wherein when viewed in a top view, the first mark pattern completely covers the dummy mark pattern, and the size of each dummy mark unit is smaller than each first mark unit, in addition, each dummy mark unit of the dummy mark pattern has a first width, each first mark unit of the first mark pattern has a second width, and the first width is smaller than half of the second width.

2. The alignment mark of claim 1, wherein the amounts of the first mark units of the first mark pattern is same as the amounts of the dummy mark units of the dummy mark pattern.

3. The alignment mark of claim 1, wherein each first mark unit of the first mark pattern has the shape same as the shape of each dummy mark unit of the dummy mark pattern.

4. The alignment mark of claim 1, wherein the dummy mark patterns directly contacts the first mark pattern.

5. The alignment mark of claim 1, wherein each first mark unit of the first mark pattern is rectangular shape, and the first mark pattern is a grid shape structure.

6. The alignment mark of claim 1, wherein each dummy mark unit of the dummy mark pattern is rectangular shape, and the dummy mark pattern is a grid shape structure.

7. The alignment mark of claim 1, wherein the first mark pattern and the dummy mark pattern are disposed on a scribe line.

8. The alignment mark of claim 1, further comprising a second mark pattern disposed in a third layer, the third layer is disposed above the second layer, the second mark pattern comprises a plurality of second mark units, each second mark unit being arranged along a second direction.

9. The alignment mark of claim 8, further comprising a second mark pattern disposed in the first layer, the second mark pattern comprises a plurality of second mark units, each second mark unit being arranged along a second direction.

10. The alignment mark of claim 9, wherein when viewed in a top view, the second mark pattern completely covers the second dummy mark pattern.

11. The alignment mark of claim 1, wherein the dummy mark units have different sizes, and the pitches between the dummy mark units are different from each other.

12. A method for measuring an alignment mark, comprising:
   providing an alignment mark, the alignment mark comprises at least one dummy mark pattern in a first layer comprises a plurality of dummy mark units arranged along a first direction, and at least one first mark pattern disposed in a second layer, the second layer is disposed above the first layer, the first mark pattern comprises a plurality of first mark units, each first mark unit being arranged in a first direction, wherein when viewed in a top view, the first mark pattern completely covers the dummy mark pattern, and the size of each dummy mark unit is smaller than each first mark unit, in addition, each dummy mark unit of the dummy mark pattern has a first width, each first mark unit of the first mark pattern has a second width, and the first width is smaller than half of the second width; and measuring the alignment mark to obtain a first signal waveform corresponding to the first mark pattern, and a second signal waveform corresponding to the dummy mark pattern, wherein the first signal waveform has a first highest value, the second signal waveform has a second highest value, and the first highest value is more than two times of the second highest value.

13. The method of claim 12, wherein the first signal waveform comprises a plurality of peaks corresponding to the boundaries of each first mark unit.

14. The method of claim 12, wherein the second signal waveform comprises a plurality of peaks corresponding to the boundaries of each dummy mark unit.

* * * * *